(12) United States Patent
Aksyuk et al.

(10) Patent No.: US 7,452,741 B2
(45) Date of Patent: Nov. 18, 2008

(54) PROCESS FOR MANUFACTURING AN APPARATUS THAT PROTECTS FEATURES DURING THE REMOVAL OF SACRIFICIAL MATERIALS

(75) Inventors: Vladimir A. Aksyuk, Westfield, NJ (US); Nagesh R. Basavanhally, Skillman, NJ (US); Omar D. Lopez, Summit, NJ (US); Chien-Shing Pai, Bridgewater, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 179 days.

(21) Appl. No.: 11/425,100

(22) Filed: Jun. 19, 2006

(65) Prior Publication Data

US 2007/0292981 A1    Dec. 20, 2007

(51) Int. Cl.
  *H01L 21/00*    (2006.01)
(52) U.S. Cl. .............................. 438/52; 438/53; 438/50; 438/48
(58) Field of Classification Search ............. 438/22–23, 438/48–52
See application file for complete search history.

(56) References Cited

U.S. PATENT DOCUMENTS

| | | | |
|---|---|---|---|
| 6,210,988 B1 * | 4/2001 | Howe et al. | 438/50 |
| 2007/0138582 A1 * | 6/2007 | Nystrom et al. | 257/416 |
| 2007/0222007 A1 * | 9/2007 | Van Beek et al. | 257/415 |

* cited by examiner

*Primary Examiner*—Dung A. Le

(57) ABSTRACT

The present invention provides a process for manufacturing an apparatus. The process, in one embodiment, includes providing a micro-electro-mechanical system (MEMS) device, the micro-electro-mechanical system (MEMS) device including an actuator coupled to a movable feature, sacrificial material fixing the actuator and movable feature with respect to one another, and a layer of material located over the actuator, movable feature and sacrificial material. The process may further include removing only a portion of the layer of material to expose the sacrificial material, and subjecting the exposed sacrificial material to an etchant to release the movable feature.

19 Claims, 10 Drawing Sheets

PROCESS FOR MANUFACTURING AN APPARATUS THAT PROTECTS FEATURES DURING THE REMOVAL OF SACRIFICIAL MATERIALS

U.S. GOVERNMENT

The U.S. Government has a paid-up license in this invention and the right in limited circumstances to require the patent owner to license others on reasonable terms as provided for by the terms of Contract No. N66001-04-C-8028 awarded by DARPA under Maskless Lithography.

TECHNICAL FIELD OF THE INVENTION

The present invention is directed, in general, to microelectronics and, more specifically, to a structure for protecting features during the removal of sacrificial materials and a method of manufacture therefore.

BACKGROUND OF THE INVENTION

Adaptive optics is a field of optics dedicated to the improvement of optical signals using information about signal distortions introduced by the environment in which the optical signals propagate. An excellent introductory text on the subject is given in "Principles of Adaptive Optics" by R. K. Tyson, Academic Press, San Diego, 1991, the teachings of which are incorporated herein by reference.

Interest in the field of adaptive optics has increased in recent years due to the demand for various adaptive optical elements for use in advanced applications such as atmospheric imaging, optical signal processing, optical data storage, high-power lasers, etc. A representative adaptive optical element is a micro-electro-mechanical system (MEMS) device that may be used, for example, in an optical system designed to compensate for signal distortions introduced in an optical image. An appropriate sensor measures the distortions and generates feedback for the MEMS device. Based on the feedback, mirrors of the MEMS device are deformed such that the distortions are significantly reduced, thus improving receiver performance.

One MEMS device, as might be used in the field of adaptive optics or other related fields, is a deformable mirror. In one instance, a deformable mirror is simulated by an array of very small mirrors, each having a reflective layer, torsional members, support posts, and electrostatic actuators (e.g., electrodes) positioned thereunder, the electrostatic actuators configured to control the torsional members, and thus control the shape of the simulated reflective deformable layer. A typical method for manufacturing such a deformable mirror includes forming the electrostatic actuators, support posts, torsional members and reflective surface using conventional materials processing, and thereafter releasing the movable elements (e.g., the torsional members and reflective surface) using a selective etch. Unfortunately, the conventional process for releasing the torsional members and reflective surface has various drawbacks, especially when used in conjunction with hybrid devices encompassing the drive circuitry.

Accordingly, what is needed in the art is an apparatus and method of manufacture therefore that accommodates the issues related to the aforementioned release step.

SUMMARY OF THE INVENTION

To address the above-discussed deficiencies of the prior art, the present invention provides a process and an apparatus. The process, in one embodiment, includes providing a micro-electro-mechanical system (MEMS) device, the MEMS device including an actuator coupled to a movable feature, sacrificial material fixing the actuator and movable feature with respect to one another, and a layer of material located over the actuator, movable feature and sacrificial material. The process may further include removing only a portion of the layer of material to expose the sacrificial material, and subjecting the exposed sacrificial material to an etchant to release the movable feature.

As previously discussed, an apparatus is also provided. The apparatus, without limitation, may include an actuator located over a substrate, a movable feature located over and coupled to the actuator, and a layer of material located above the actuator and movable feature, the layer of material configured as a reservoir to expose the movable feature.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

The present invention is based, at least in part, on the acknowledgement that conventional micro-electro-mechanical system (MEMS) manufacturing steps, particularly those steps required to release movable feature, are problematic. More specifically, the present invention has acknowledged that the etchant generally used to release the aforementioned movable features may have a negative impact on other components associated with the MEMS device. For instance, it has been observed that in those circumstances wherein the MEMS device is directly coupled to a substrate including drive circuitry (e.g., flip-chip bonded to a substrate including the drive circuitry) prior to releasing the movable features, the etchant tends to negatively effect, if not destroy, the drive circuitry when the release occurs.

Based upon the previously discussed acknowledgments and observations, the present invention has recognized that the aforementioned problems may be reduced, or even eliminated, by keeping the etchant separate from any components that it may negatively effect. The present invention recognizes that such a separation may be achieved, at least in one embodiment, by removing only a portion (i.e., less than an entire amount) of a layer of material located over the components to be released, a remaining portion of the layer of material helping separate the etchant from those components that it may negatively effect. The present invention further recognizes, in an alternative embodiment, that such a separation may be achieved by creating a reservoir in the layer of material located over the components to be released, the reservoir containing the etchtant and thereby helping separate the etchant from those components that it may negatively effect.

Figure 1A:
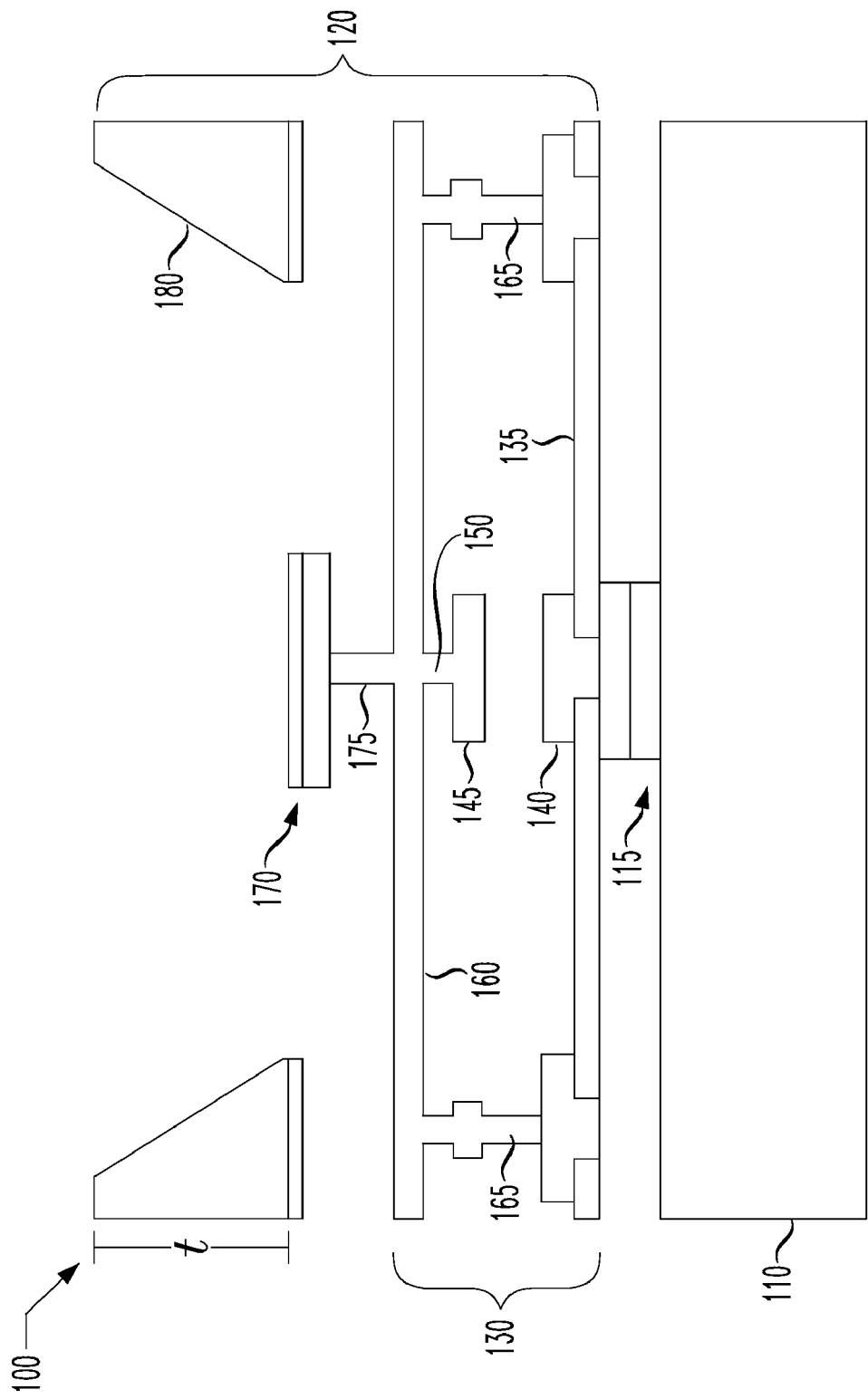
FIGS. 1A and 1B illustrate an apparatus configured in accordance with the principles of the present invention.
Figure 1B:
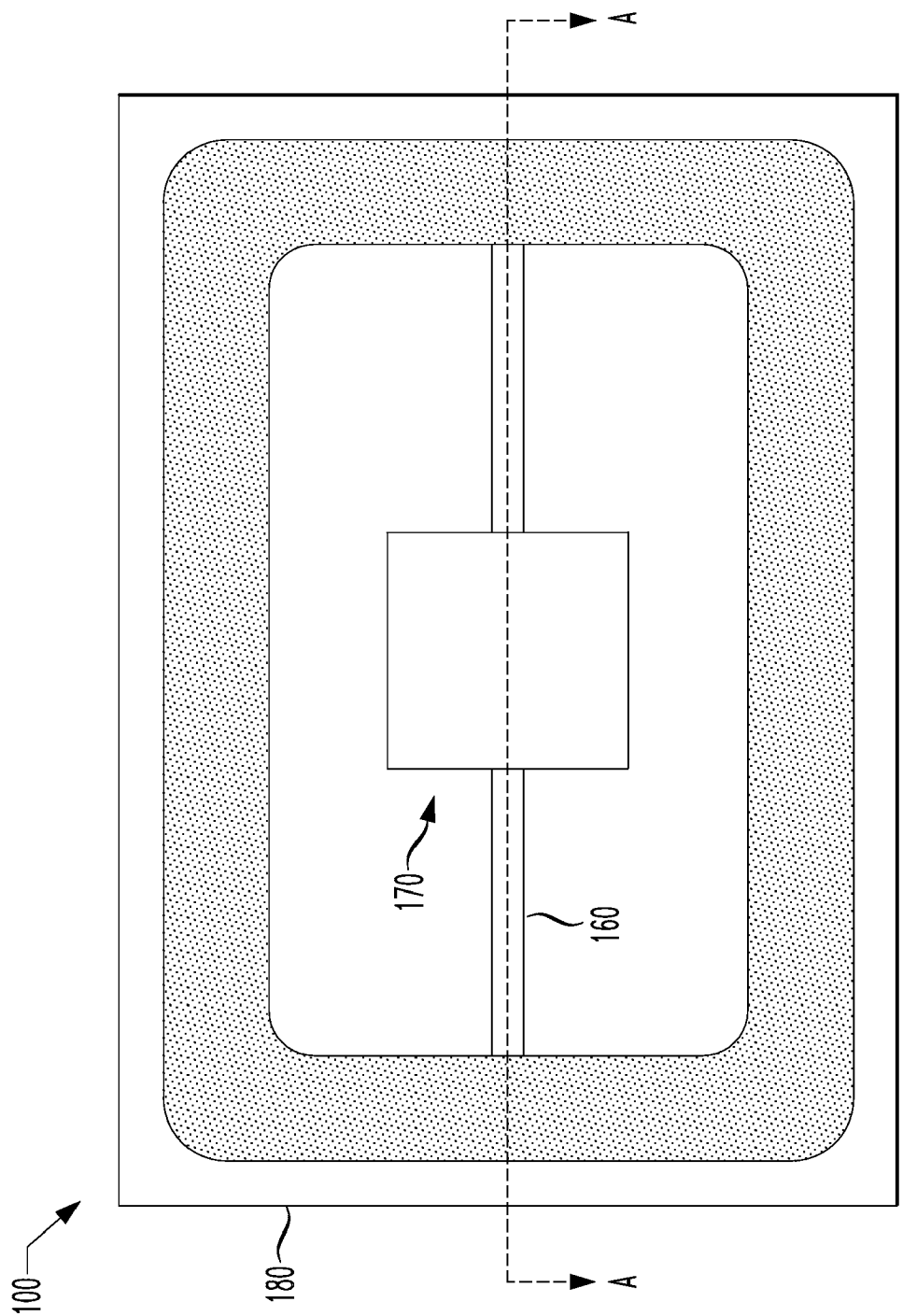

Turning initially to FIGS. 1A and 1B, illustrated is an apparatus 100 configured in accordance with the principles of the present invention. FIG. 1A illustrates a cross-sectional view of the apparatus 100 taken through the line A-A of the plan view of FIG. 1B. The apparatus 100 of FIGS. 1A and 1B includes a MEMS device; however, other embodiments may exist wherein the apparatus 100 includes various different devices (e.g., other different microelectronic devices) and remain within the purview of the present invention. Accordingly, the present invention should not be limited to any one specific device, and particularly should not be limited to the inclusion of a MEMS type device.

The apparatus 100 of FIGS. 1A and 1B initially includes a substrate 110. The substrate 110, in one embodiment, includes drive circuitry or other active circuitry configured to operate and/or control the features located thereover. For instance, in the embodiment wherein the apparatus 100 includes a MEMS device, the drive circuitry or active circuitry might be used to effectuate a move therein. Those skilled in the art understand the type of circuitry that might be included within the substrate 110.

Coupled to the substrate 110 using a bond 115 (e.g., solder bump bond in one embodiment) is a MEMS device 120. The MEMS device 120 illustrated in FIGS. 1A and 1B includes, among other elements, an actuator 130, a movable feature 170 coupled to the actuator 130, and a layer of material 180 located above the actuator 130 and movable feature 170. In the given embodiment of FIGS. 1A and 1B, the MEMS device 120, and more particularly a side of the MEMS device 120 opposite the layer of material 180 is flip-chip bonded to the substrate 110 using the bond 115. As is appreciated by those skilled in the art, the drive circuitry in the substrate 110 could thereby provide a drive signal to the MEMS device 120 via the bond 115.

The actuator 130 illustrated in the embodiment of FIGS. 1A and 1B includes a stationary electrode 140 attached to a support substrate 135. The actuator 130 further includes a movable electrode 145 positioned over the stationary electrode 140. As is illustrated, the movable electrode 145 may be connected to a spring (flexible beam) 160 by a support pole 150. Moreover, the spring 160 may be supported over the support substrate 135 using one or more anchors 165.

Motion of the movable electrode 145 is transferred to spring 160 via support pole 150 and to the movable feature 170 via a support pole 175 attached between the spring 160 and the movable feature 170. When a voltage differential is applied between the stationary electrode 140 and movable electrode 145 of the actuator 130, an attractive electrostatic force is generated between the electrodes 140, 145 causing the movable electrode 145 to move toward the stationary electrode 140. Motion of the movable electrode 145 therefore deforms spring 160 (e.g., generating a counteracting spring force), which is transferred to movable feature 170 via support poles 150 and 175. When the voltage differential is removed, the spring force of the deformed spring 160 returns the movable electrode 145 and movable feature 170 to their initial positions.

The movable feature 170 illustrated in FIGS. 1A and 1B comprises a movable reflective feature (e.g., movable mirror). Alternatively, however, the movable feature 170 could comprise a movable membrane, a feature for effectuating movement of a different feature positioned thereover, etc., among other structures. Therefore, the present invention should not be limited to any specific movable feature 170.

As was previously indicated, a layer of material 180 is positioned above the actuator 130 and the movable feature 170. The layer of material 180 may comprise many different materials, configurations and/or placements and remain within the purview of the present invention. The layer of material 180 illustrated in FIGS. 1A and 1B comprises silicon, for example a silicon handle (e.g., original silicon layer) that the movable feature 170 and actuator 130 were originally formed thereon. In this embodiment, the layer of material comprising silicon would have a thickness (t) ranging from about 100 microns to about 750 microns. If the layer of material 180 were not a silicon handle, the thickness of the layer of material 180 might be less than the thickness (t) range given.

The layer of material 180 in the embodiment of FIGS. 1A and 1B is configured as a reservoir. As will be understood more fully below, the reservoir configuration of the layer of material 180 is particularly beneficial to the process for releasing the movable feature 170. Particularly, the reservoir configuration of the layer of material 180 substantially, if not completely, confines the etchant used to remove the sacrificial material (e.g., the material that initially fixes the movable feature 170 to the actuator 130). Said another way, the reservoir configuration of the layer of material 180 keeps the etchant away from unwanted components, for example the drive circuitry of the substrate 110.

The apparatus 100 of FIGS. 1A and 1B includes many benefits of other conventional apparatuses. Foremost, however, the apparatus 100 of FIGS. 1A and 1B does not experience the issues generally associated with the release process, and thus does not experience the reliability issues experiences by other conventional apparatuses. Other benefits are nonetheless also achieved.

Figure 2:
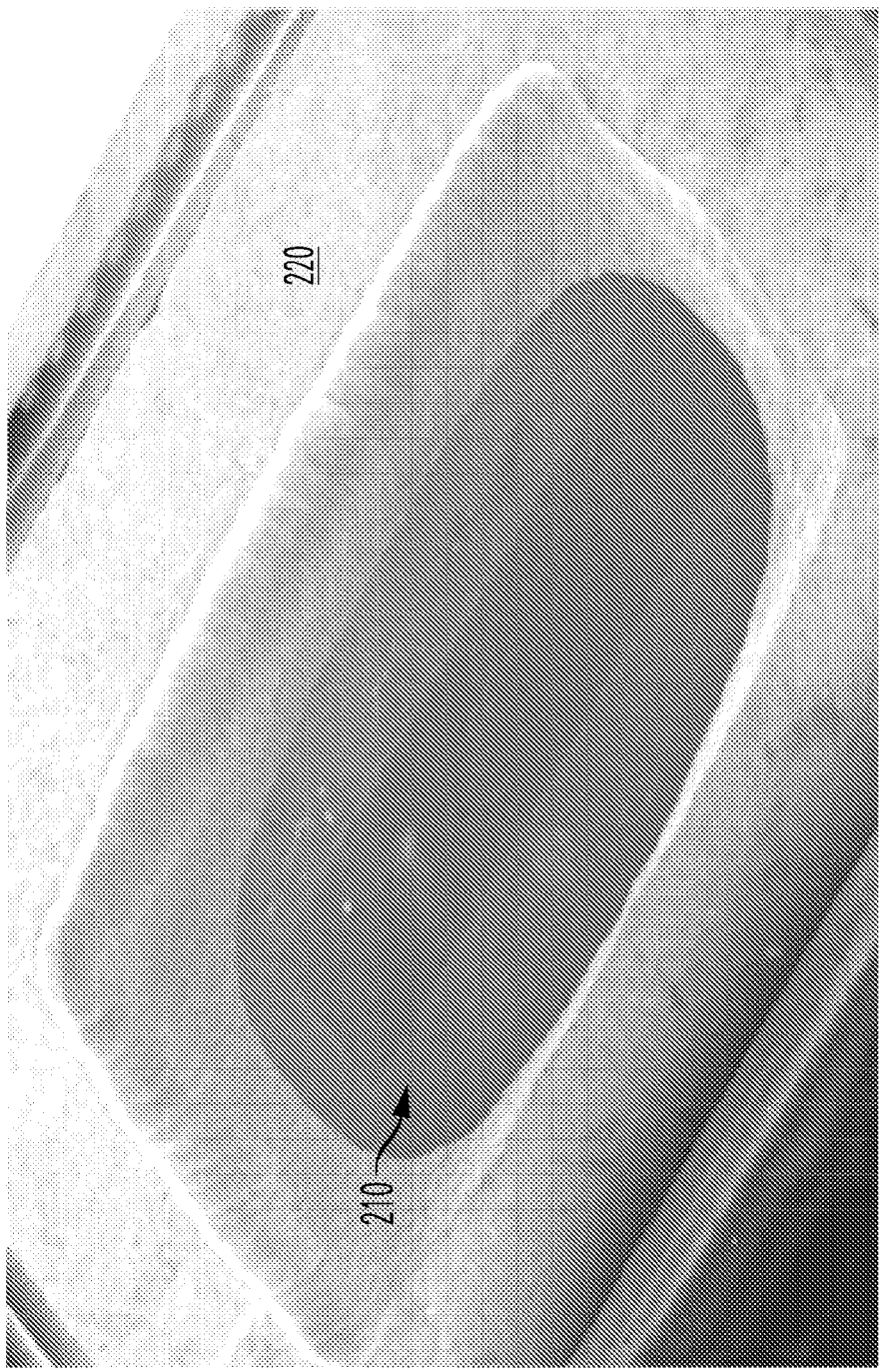
FIG. 2 illustrates a SEM image of an alternative apparatus configured in accordance with the principles of the present invention.

Turning now to FIG. 2, illustrated is a SEM image of an alternative apparatus 200 configured in accordance with the principles of the present invention. The apparatus 200 of FIG. 2 differs from the apparatus 100 of FIG. 1 in that the apparatus 200 of FIG. 2 includes an array of actuators and movable features 210 disposed over the substrate. Additionally, a layer of material 220 located above the array of actuators and movable features 210 is configured as a reservoir to expose the array of actuators and movable features 210, while confining the aforementioned etchant. The apparatus 200 of FIG. 2 illustrates that the layer of material 220, and more particularly the reservoir in the layer of material 220, need not be confined to a device-by-device basis (e.g., a single MEMS feature), but can be easily configured for an array of devices.

Turning now to FIGS. 3 thru 8, illustrated are various cross-sectional views illustrating how one skilled in the art might manufacture an apparatus in accordance with the principles of the present invention. The apparatus 300 illustrated in FIG. 3 initially includes components of a MEMS device 305, including a layer of material 310, a movable feature 315, and an actuator 320, among others. The layer of material 310, in one particular embodiment, comprises silicon, such as what might be found in a silicon wafer or silicon handle. In those embodiments wherein the layer of material 310 comprises silicon from a silicon wafer or silicon handle, the layer of material 310 might have a thickness (t) ranging from about 100 microns to about 750 microns, among others. In alternative embodiments, the layer of material 310 comprises a material different than silicon, for instance silicon carbide or another similar material. In those embodiments, the thickness (t) of the layer of material 310 might differ from the range set forth above.

Figure 3:
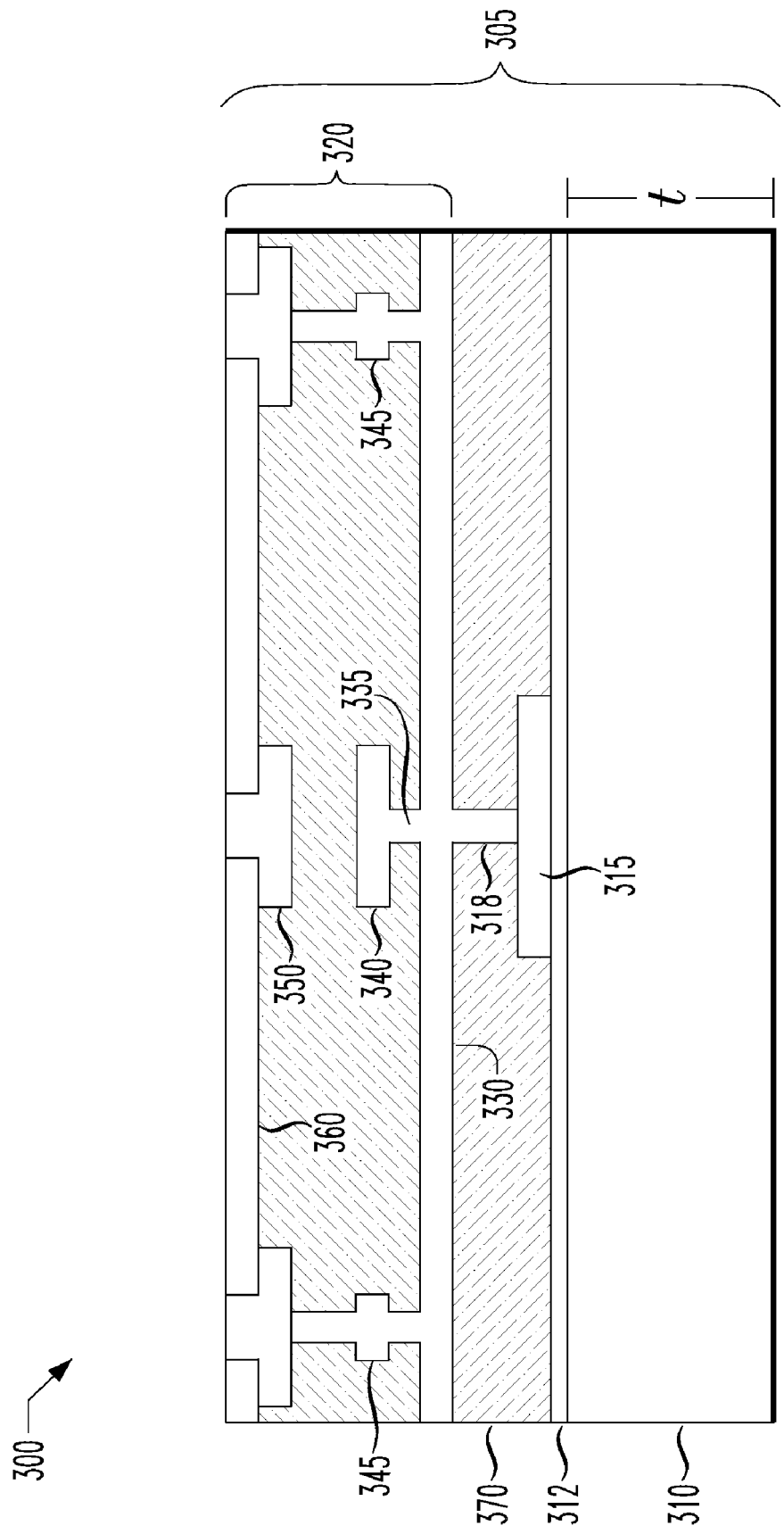
FIGS. 3 thru 8 illustrate various cross-sectional views illustrating how one skilled in the art might manufacture an apparatus in accordance with the principles of the present invention.

In the embodiment of FIG. 3, an etch stop layer 312 is formed over the layer of material 310. The etch stop layer 312 in one embodiment is an oxide portion of a silicon-on-insulator (SOI) structure. The etch stop layer 312, in alternative embodiments, might comprise a different material. The etch stop layer 312 may include many different thicknesses.

Formed over the layer of material 310 and etch stop layer 312 is the movable feature 315 and actuator 320. As is illustrated, the movable feature 315 is coupled to the actuator 320 using a support pole 318. The movable feature 315, without limitation, may comprise a material commonly used in the manufacture of microelectronic devices, for instance polysilicon, silicon, etc.

The actuator 320 illustrated in the embodiment of FIG. 3 includes a spring (flexible beam) 330 connected to the movable feature 315 using the aformentioned support pole 318. Coupled to the spring 330 using a support pole 335 is a movable electrode 340. The actuator 320 further includes a stationary electrode 350 attached to a support substrate 360, and disposed a distance from the movable electrode 340. As is illustrated, multiple anchors 345 may support and separate the spring 330 (and thus the movable electrode 340) and the support substrate 360 (and thus the stationary electrode 350). The components of the actuator 320, again without limitation, may comprise a material commonly used in the manufacture of microelectronic devices, for instance polysilicon, etc.

In the illustrative embodiment of FIG. 3, the movable feature 315 and the actuator 320 are fixed with respect to one another. For instance, at this stage of manufacture, a sacrificial material 370 is used to fix the features 315, 320, with respect to one another. The sacrificial material 370, in one embodiment, comprises a silicon oxide (e.g., silicon dioxide). The skilled artisan understands that the sacrificial material 370 could comprise other materials.

The MEMS device 305 illustrated in FIG. 3 may, in one embodiment, be formed using conventional manufacturing processes. For instance, knowing the unique layout and order of formation of the features of the MEMS device 305, one skilled in the art would understand what manufacturing processes might be required to follow that layout and order of formation, and thus result with an apparatus 300 similar to that of FIG. 3. Accordingly, while the layout and order of forming the features of the MEMS device 305 is not well-known (i.e., is unique), the manufacturing process used to achieve the layout and order of forming the features may be conventional. Because the manufacturing process required to achieve the apparatus 300 of FIG. 3 is conventional, no further detail is needed.

Figure 4:
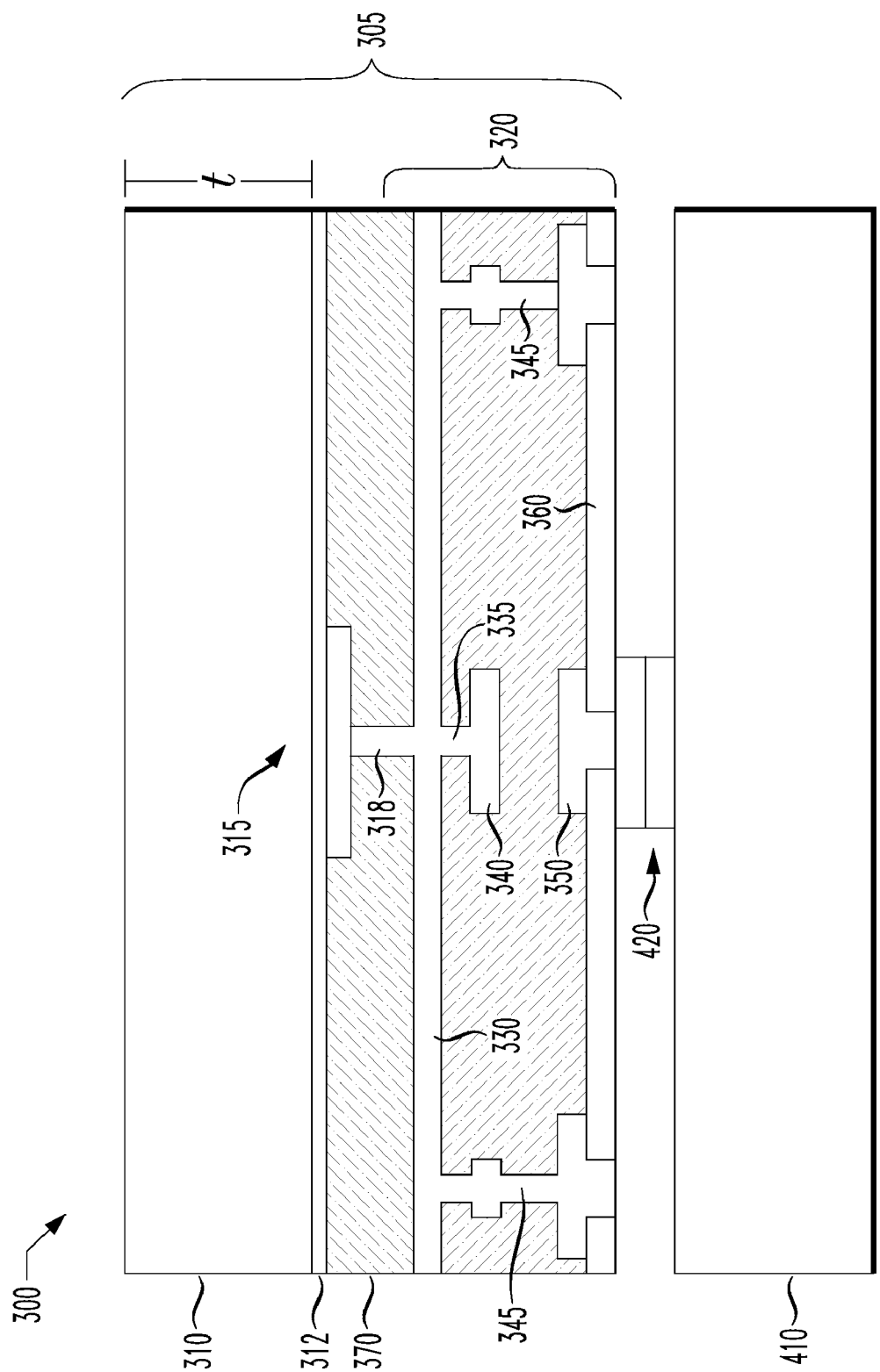

Turning now to FIG. 4, illustrated is the apparatus 300 of FIG. 3 after inverting the MEMS device 305 and flip-chip bonding it to a substrate 410. The substrate 410, in one embodiment, includes drive circuitry or other active circuitry configured to operate and/or control the features located thereover. For instance, in the embodiment wherein the apparatus 300 includes the MEMS device 305, the drive circuitry or active circuitry might be used to effectuate a move therein. Those skilled in the art understand the type of circuitry that might be included within the substrate 110, thus no further detail is given.

In the illustrative embodiment shown, the MEMS device 305 is flip-chip bonded to the substrate 410 using a bond 420. The bond 420 may comprise many different bonds; however, one embodiment uses a solder bump bond to physically and electrically coupled the MEMS device 305 and the substrate 410. The process that might be used to bond the MEMS device 305 to the substrate 410 may be conventional, including placing the MEMS device 305 in contact with the substrate 410 with solder therebetween, and heating the MEMS device 305, substrate 410 and solder past a reflow temperature of the solder, thereby forming the bond 420.

Figure 5A:
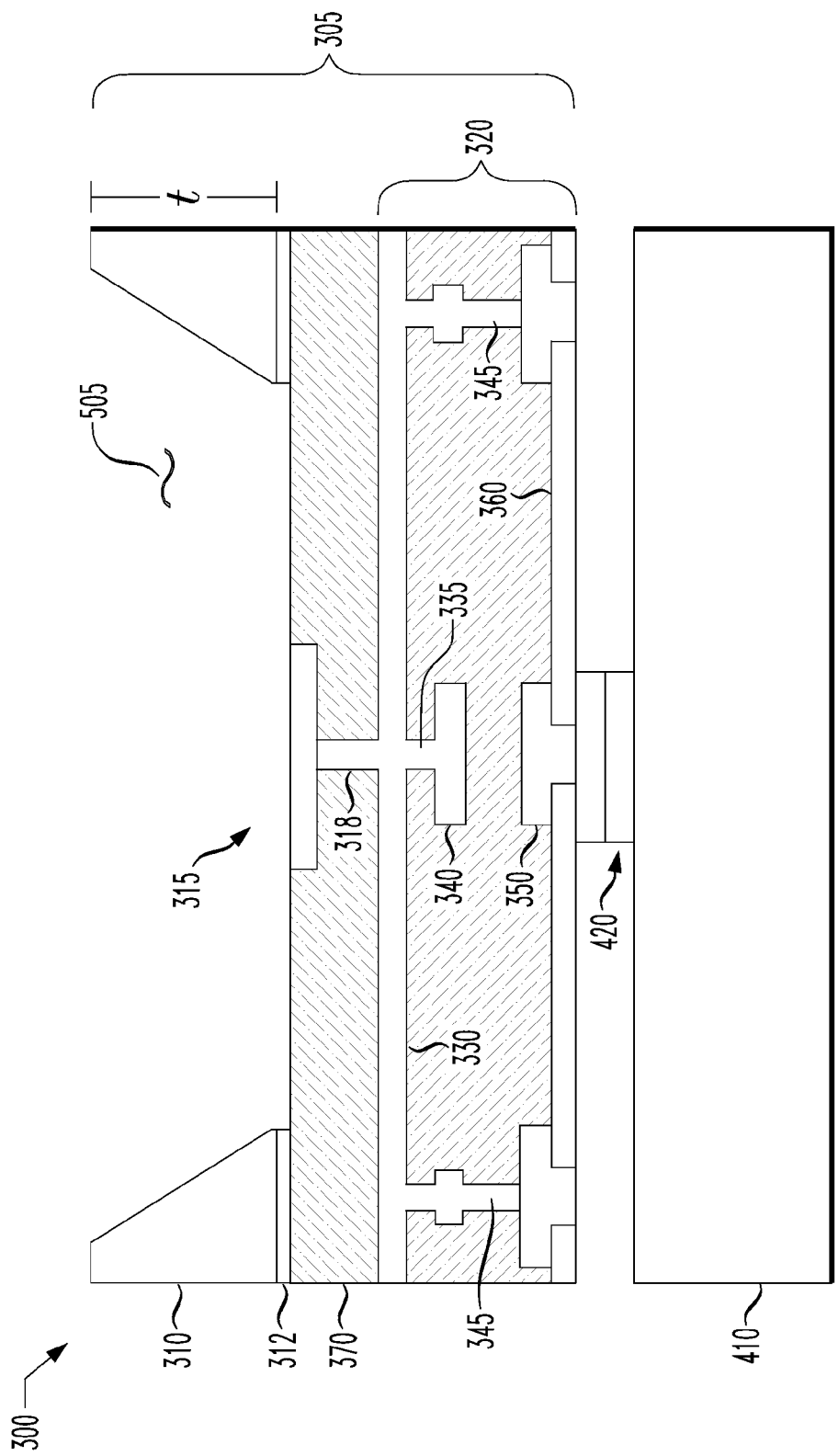

Turning now to FIG. 5A, illustrated is the apparatus 300 of FIG. 4 after removing only a portion (i.e., less than an entire amount) of the layer of material 310, thereby exposing the sacrificial material 370. In the embodiment shown in FIG. 5A, a remaining portion of the layer of material 310 forms a reservoir 505 (e.g., dam). The remaining portion of the layer of material 310, however, may comprise other configurations or shapes and remain within the purview of the present invention.

The process for removing only a portion of the layer of material 310 may vary greatly based upon the size of the opening, type of material that the layer of material 310 comprises, as well as other factors. In one embodiment, however, a fixture could be used to expose the area of the layer of material 310 that should be removed, such that an etchant (e.g., a selective etchant) could be used to remove the desired portion of the layer of material 310. As those skilled in the art appreciate, the etch stop layer 312 is configured to substantially prevent the etchant from etching into the movable feature 315. Accordingly, the etch stop layer 312 would be removed after forming the reservoir 505 in the layer of material 310.

Figure 5B:
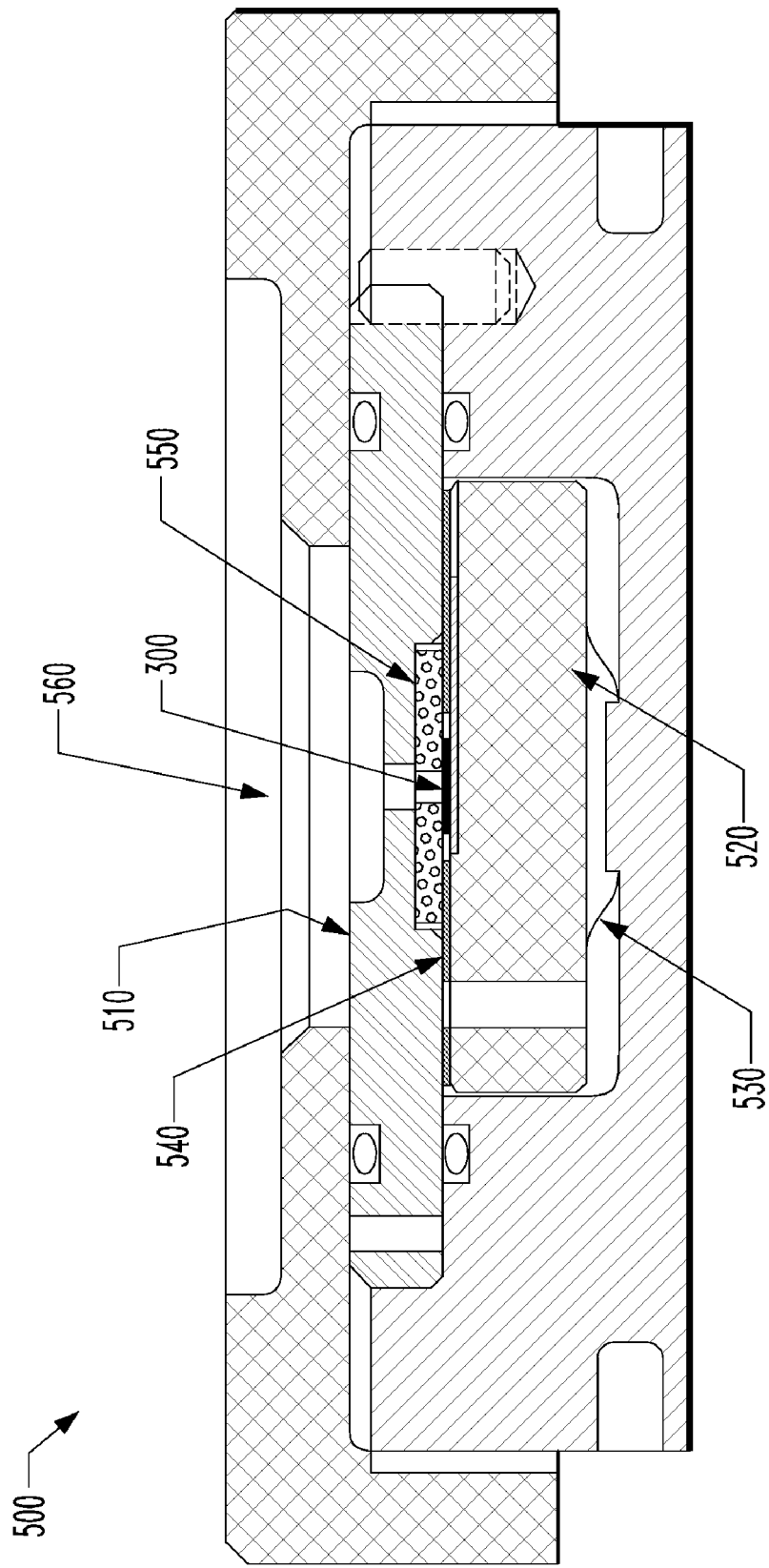

Turning briefly to FIG. 5B, illustrated is a cross-sectional view of an embodiment of a fixture 500 that might be used to remove the portion of the layer of material 310 from the apparatus 300. The fixture 500, in the embodiment shown, includes a first pressure plate 510 and a second pressure plate 520, wherein a spring 530 is connected to the second pressure plate 520 to maintain the apparatus 300 in the correct position. The fixture 500 of FIG. 5B further includes a spacer 540 placed between the first and second pressure plates 510, 520, the spacer 540 typically being roughly the same thickness as the apparatus 300. The fixture 500 additionally includes a gasket 550, such as a viton gasket, which specifically defines the area for removal of the layer of material 310 (FIG. 5A). The gasket 550 additionally seals the other areas of the layer of material 310 (especially the other areas of the apparatus 300, including the substrate 310) from the etchant used to remove the portion of the layer of material 310.

The fixture 500 might be used by placing the apparatus 300 between the first and second pressure plates 510, 520, such as is shown in FIG. 5B. In doing so, an opening 560 exposes the appropriate area of the layer of material 310 in the apparatus 300. Thereafter, the apparatus 300, and more specifically the layer of material 310, could be subjected to a selective removal process (e.g., a wet or dry etch) through the opening 560. After removing any remaining etch stop layer 213, what might result is an apparatus similar to the apparatus 300 illustrated in FIG. 5A. While the fixture 500, and a process for using the fixture 500 has been described within this and the preceding paragraph, those skilled in the art appreciate that other fixtures and processes might be used to remove only the portion of the layer of material 310.

Figure 6:
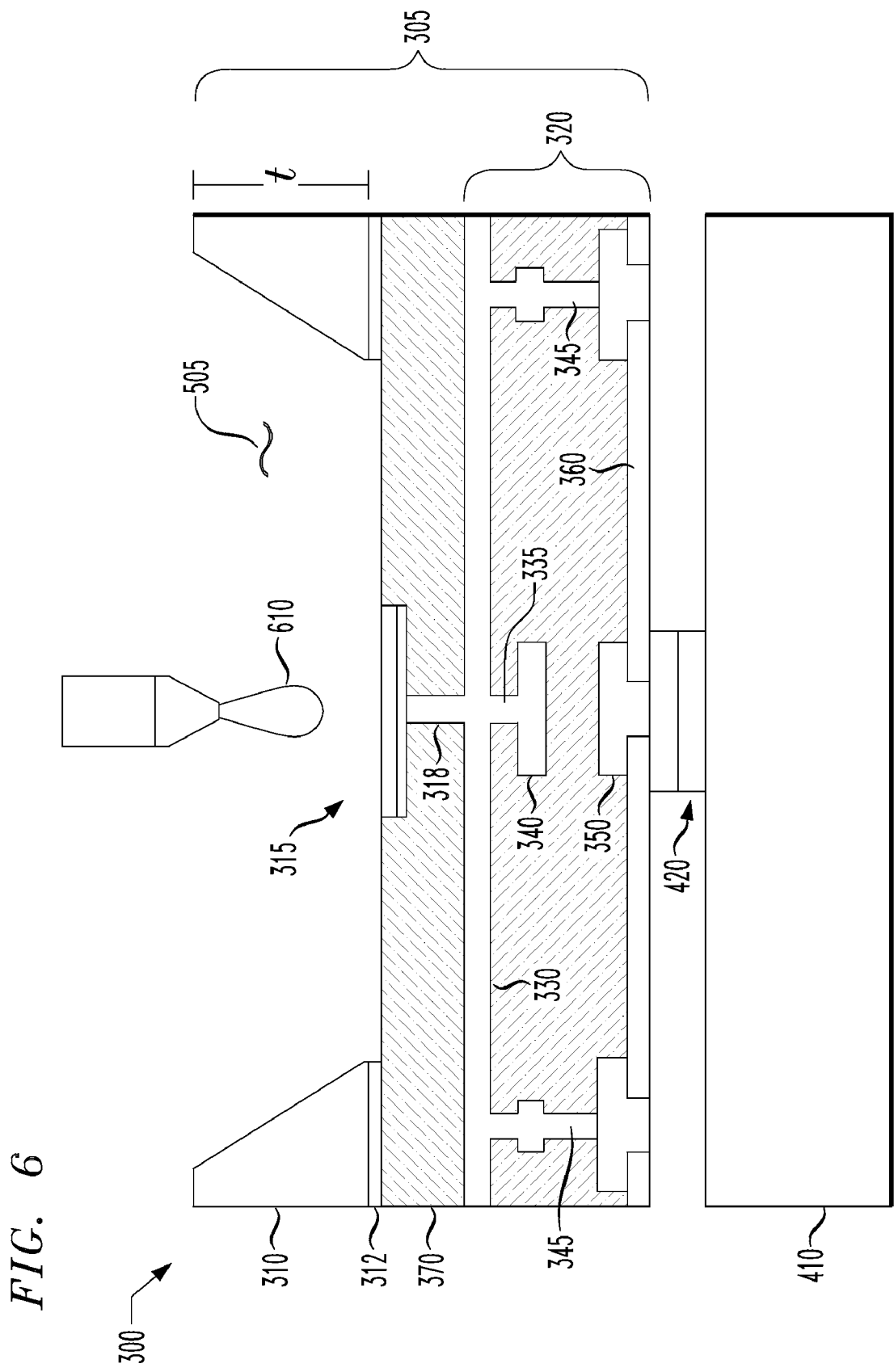

Turning now to FIG. 6, illustrated is the apparatus 300 of FIG. 5A as the exposed sacrificial material 370 is being subjected to an etchant 610 to release the movable feature 315.

More specifically, in the embodiment of FIG. 6 the etchant 610 is being placed within the reservoir 505 formed within the layer of material 310 to release the movable feature 315. Advantageous to the present invention, the remaining portion of the layer of material 310 protects various other features of the apparatus 300 from the etchant 610. Accordingly, any drive circuitry or other sensitive circuitry in the substrate 410 is substantially protected from the etchant 610.

In the embodiment wherein the sacrificial material 370 comprises silicon dioxide, the etchant 610 might be hydrofluoric acid or another similar selective etchant. In this embodiment, it is desirable that the hydrofluoric acid should be dispensed in an amount sufficient to remove the entire sacrificial material 370, but an amount not too large as to escape the bounds of the remaining portion of the layer of material 310. In other embodiments wherein the sacrificial material comprises a different material, a different etchant 610 might be used.

At this stage in the manufacture of the apparatus 300, that is after subjecting the sacrificial material 370 to the etchant 610, the apparatus 300 might be subjected to a diluting bath (e.g., a methanol bath) to neutralize the effects of the etchant 610. Thereafter, the apparatus 300 might be inserted into a critical point dryer, among others, to substantially dry the resulting apparatus 300. Given all the previous discussions, those skilled in the art would understand this process of neutralizing and drying the apparatus. Accordingly, no further detail is given.

Figure 7:
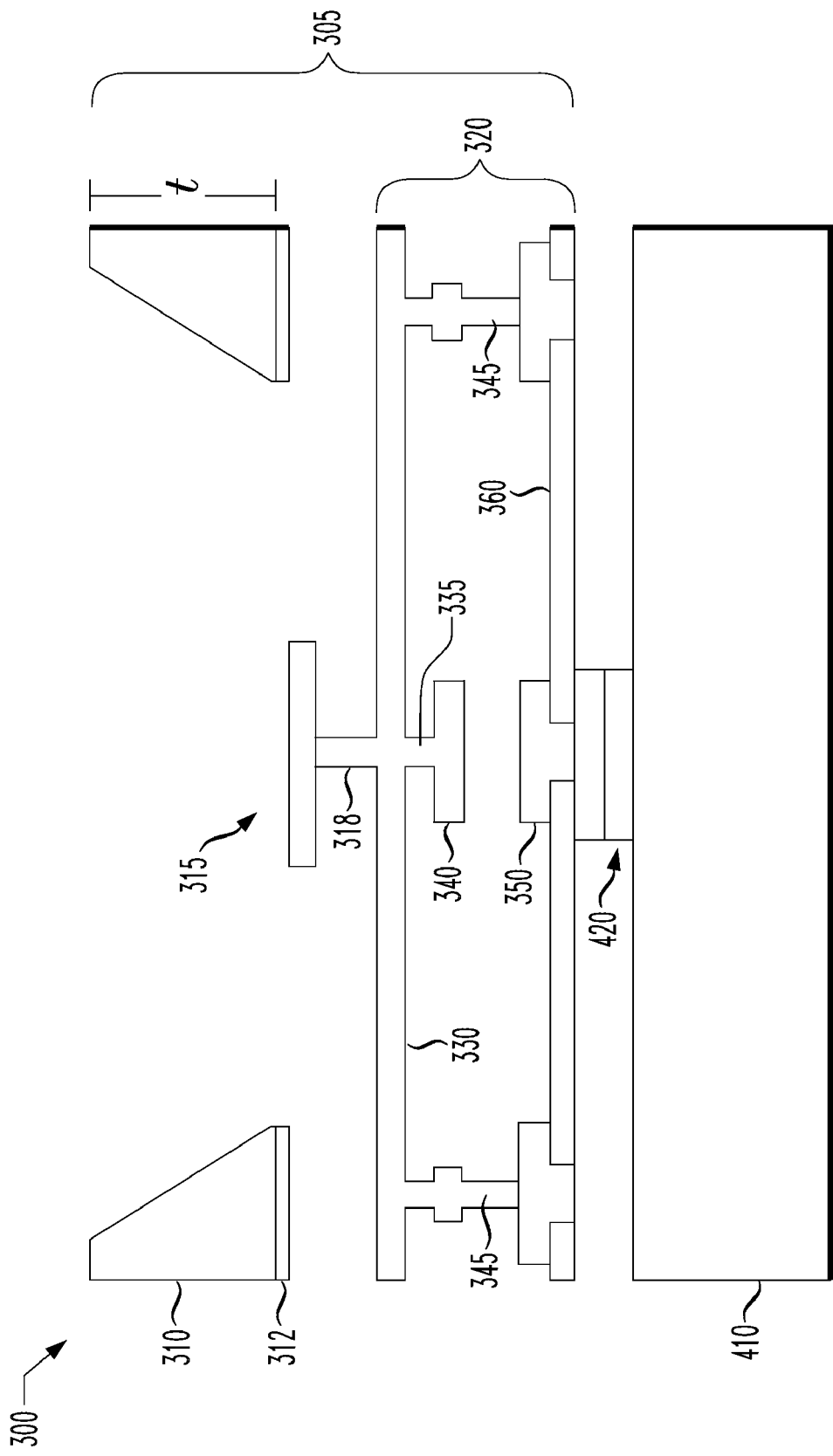

Turning now to FIG. 7, illustrated is the apparatus of FIG. 6 after releasing the movable feature 315 by removing the sacrificial material 370. The resulting apparatus 300, as one skilled would expect, would generally still have the remaining portions of the layer of material 310. In many, if not most instances, the remaining portions of the layer of material 310 would remain.

Figure 8:
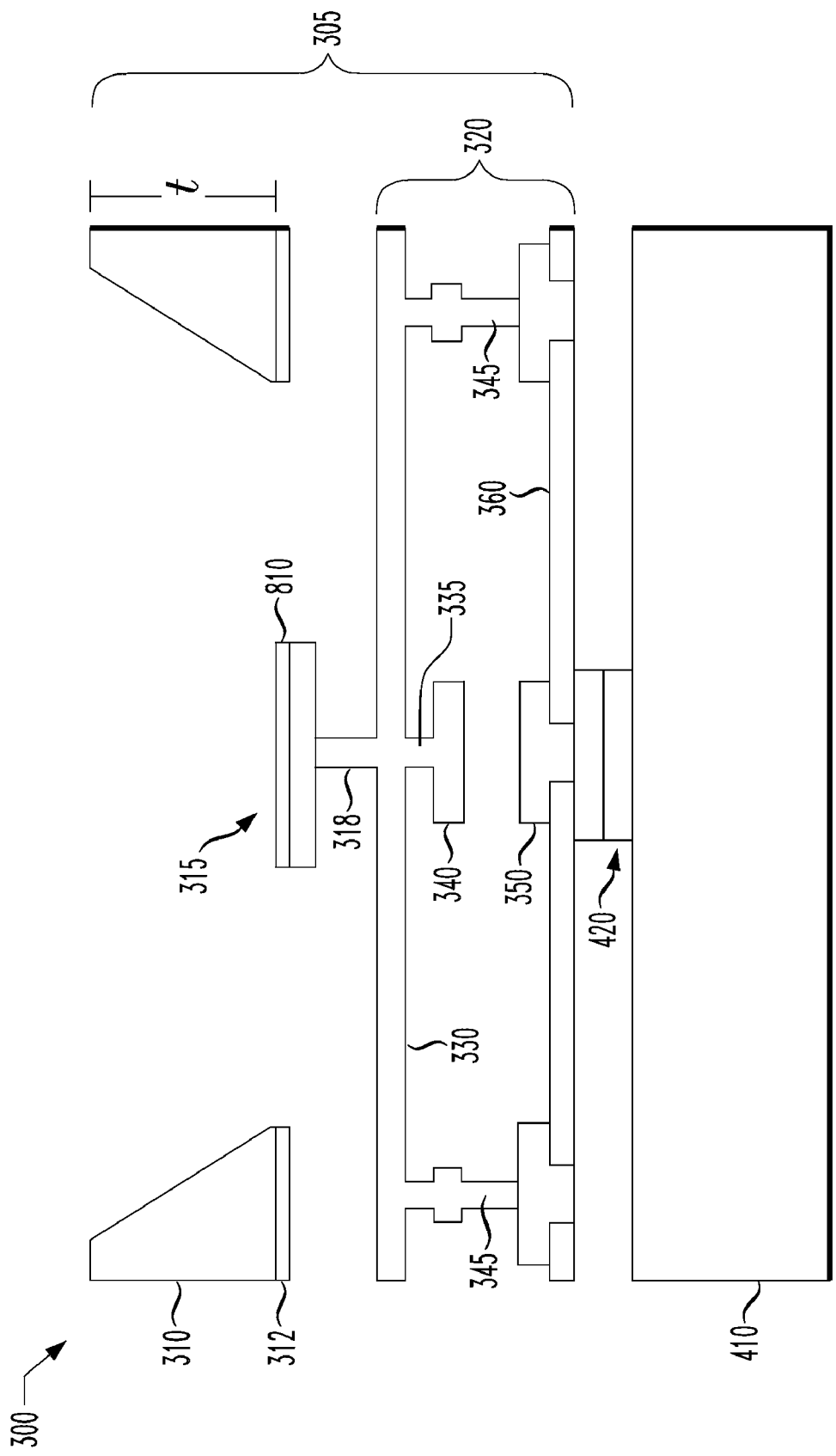

Turning lastly to FIG. 8, illustrated is the apparatus 300 of FIG. 7 after forming a layer of reflective material 810 over the movable feature 315. The reflective material 810, if used, could comprise many different materials and remain within the purview of the present invention. Additionally, conventional processes might be used to form the layer of reflective material 810, again only if this layer was used.

The process of FIGS. 3 thru 8 illustrates but one embodiment. For example, another embodiment might exist wherein multiple apparatuses similar to the apparatus 300 of FIGS. 3 thru 8 are formed on a single layer of material 310. In that embodiment, multiple reservoirs 505 would be formed within the layer of material 310 to expose each of the multiple apparatuses. In such an embodiment, the etchant 610 could simultaneously be used to release multiple movable features 315. Accordingly, the multiple apparatuses would be formed in parallel. In an additional embodiment, each of the multiple apparatuses could then be laterally separated from one another, for example by dicing. What would result would be multiple, but separate, apparatuses that were formed using the same processing steps.

The process described with respect to FIGS. 3 thru 8 also provides many benefits over prior art processes. The main benefit, however, is the ability to use the layer of material, which is preexisting in certain embodiments, to shield sensitive circuitry from the etchant used to release the movable features of the apparatus.

Although the present invention has been described in detail, those skilled in the art should understand that they can make various changes, substitutions and alterations herein without departing from the spirit and scope of the invention in its broadest form.

What is claimed is:

1. A process, comprising:
providing a micro-electro-mechanical system (MEMS) device, the micro-electro-mechanical system (MEMS) device including an actuator coupled to a movable feature, sacrificial material fixing the actuator and movable feature with respect to one another, and a layer of material located over the actuator, movable feature and sacrificial material;
removing only a portion of the layer of material to form a reservoir that exposes at least a portion of the sacrificial material; and
placing a wet etchant within the reservoir and in contact with the exposed sacrificial material to release the movable feature.

2. The process of claim 1 wherein placing includes subjecting the sacrificial material to an etchant including hydrofluoric acid.

3. The process of claim 1 further including positioning the micro-electro-mechanical system (MEMS) device in a diluting bath after the placing, and then inserting the micro-electro-mechanical system (MEMS) into a critical point dryer.

4. The process of claim 1 further including flip-chip bonding a side of the micro-electro-mechanical system (MEMS) device opposite the layer of material to a substrate including drive circuitry, the flip-chip bonding occurring prior to placing.

5. The process of claim 4 wherein a remaining portion of the layer of material protects the drive circuitry from the etchant.

6. The process of claim 1 wherein providing includes forming the layer of material, forming the movable feature over the layer of material, and then forming the actuator and at least a portion of sacrificial material over the layer of material.

7. The process of claim 1 further including placing a reflective material over the movable feature after placing.

8. The process of claim 1 wherein the layer of material has a thickness ranging from about 100 microns to about 750 microns.

9. The process of claim 1 wherein the layer of material comprises silicon.

10. The process of claim 1 wherein removing includes removing using a process that is selective to the layer of material.

11. A process, comprising:
providing a micro-electro-mechanical system (MEMS) device, the micro-electro-mechanical system (MEMS) device including an array of actuators and associated movable features, sacrificial material fixing the array of actuators and associated movable features with respect to one another, and a layer of material located over the array of actuators and associated movable features and sacrificial material;
removing only a portion of the layer of material to form a reservoir that exposes at least a portion of the sacrificial material; and
placing a wet etchant within the reservoir and in contact with the exposed sacrificial material to release the associated movable features.

12. The process of claim 11 wherein placing includes subjecting the sacrificial material to an etchant including hydrofluoric acid.

13. The process of claim 11 further including positioning the micro-electro-mechanical system (MEMS) device in a diluting bath after the placing, and then inserting the micro-electro-mechanical system (MEMS) into a critical point dryer.

14. The process of claim 11 further including flip-chip bonding a side of the micro-electro-mechanical system (MEMS) device opposite the layer of material to a substrate including drive circuitry, the flip-chip bonding occurring prior to placing.

15. The process of claim 14 wherein a remaining portion of the layer of material protects the drive circuitry from the etchant.

16. The process of claim 11 wherein providing includes forming the layer of material, forming the movable feature over the layer of material, and then forming the actuator and at least a portion of sacrificial material over the layer of material.

17. The process of claim 11 further including placing a reflective material over the movable feature after placing.

18. The process of claim 11 wherein the layer of material has a thickness ranging from about 100 microns to about 750 microns.

19. The process of claim 11 wherein only a single reservoir exists in the layer of material.

* * * * *